US005450266A

United States Patent [19]

Downie

[11] Patent Number: 5,450,266

[45] Date of Patent: Sep. 12, 1995

[54] SUPERCONDUCTING FAULT CURRENT LIMITER

[75] Inventor: Neil A. Downie, Surrey, England

[73] Assignee: The BOC Group plc, Surrey, United Kingdom

[21] Appl. No.: 350,515

[22] Filed: Dec. 6, 1994

Related U.S. Application Data

[63] Continuation of Ser. No. 845,295, Mar. 3, 1992, abandoned.

[30] Foreign Application Priority Data

Mar. 4, 1991 [GB] United Kingdom ................. 9104513

[51] Int. Cl.[6] ................................................ H02H 9/00

[52] U.S. Cl. ........................................ 361/19; 361/58; 361/93

[58] Field of Search ...................... 361/19, 58, 93, 103; 505/881, 850; 174/15

[56] References Cited

U.S. PATENT DOCUMENTS

| | | | |
|---|---|---|---|
| 4,020,274 | 1/1976 | Dean | 174/15 |
| 4,486,800 | 12/1984 | Franksen | 361/19 |
| 4,994,932 | 2/1991 | Okamoto | 361/19 |

FOREIGN PATENT DOCUMENTS

| | | | |
|---|---|---|---|
| 315976 | 5/1989 | European Pat. Off. | H02H 7/00 |
| 345767 | 12/1989 | European Pat. Off. | H01L 39/16 |
| 135314 | 4/1979 | Germany | H02H 9/02 |
| 83399 | 7/1991 | Germany | H02H 9/02 |
| 2225930 | 5/1989 | United Kingdom | H02H 9/02 |

OTHER PUBLICATIONS

Research Disclosure 330, "Cryogenic System for Fault Current Limiter":, No. 330112, pp. 829–831 (Oct. 1991).

K. E. Gray et al., Journal of Applied Physics, "A Superconducting Fault-current Limiter", vol. 49, No. 4, pp. 2546–2250 (Apr. 1978).

*Primary Examiner*—A. D. Pellinen
*Assistant Examiner*—S. Jackson
*Attorney, Agent, or Firm*—David A. Draegert; Larry R. Cassett; R. Hain Swope

[57] ABSTRACT

A fault current limiter for use in alternating current transmission utilizes a (high temperature) superconductor body. If the current density through the body exceeds a critical value, the superconductor becomes a resistor; the fault current limiter makes use of this principle. In order to enable the critical current density to be selected from within a range of different values, the superconductor is immersed in a volume of cryogenic liquid, e.g. liquid nitrogen, in a vessel provided with a closure having an outlet communicating with a duct in which is disposed a manually adjustable back pressure regulator. The back pressure regulator enables the pressure in the ullage space of the vessel to be set at a chosen value, usually below atmospheric pressure. The liquid nitrogen is stored in the vessel at its boiling point which depends on the pressure in the ullage space. Accordingly, the temperature of the liquid nitrogen can be set by the regulator. This temperature in turn determines the value of the critical current density.

15 Claims, 1 Drawing Sheet

20 20 18 12 14 16 24 26 4 30 28 10 8 32 6 22 2

SUPERCONDUCTING FAULT CURRENT LIMITER

This is a continuation of application Ser. No. 07/845,295 filed on Mar. 3, 1992, now abandoned.

TECHNICAL FIELD

This invention relates to a cryogenic apparatus and to fault current limiting apparatus including the cryogenic apparatus.

BACKGROUND OF THE PRIOR ART

It is common practice to protect electrical power distribution systems against short circuits or other causes of overloading. Circuit breakers are used for this purpose in conjunction with suitable means for instantaneously sensing an overload. The circuit breakers typically include relatively heavy and slow moving mechanical parts. Accordingly, available circuit breakers have a time delay corresponding to the duration of a few cycles of a 50 Hertz AC supply. Even within such a short period of time, the overload can cause damage to electrical equipment at the end of the power transmission line. Moreover, there is a risk of the circuit breaker itself being damaged by a short circuit current such as it fails without breaking the circuit. Extensive damage can then be done to equipment at the end of the power transmission line. A generally Known way of rapidly reducing a short circuit current is to connect a current limiting element in series with a circuit breaker.

Such devices, called "fault current limiters", are Known to make possible simplification of the construction of the circuit breaker. Different kinds of fault current limiters are Known, including ones based on the use of a superconductor and a parallel current limiting resistor or reactance.

An article in Journal of Applied Physics, 49(4), April 1978, pages 2546 to 2550 by K E Gray and D Fowler entitled "A Superconducting Fault Current Limiter" describes such a device. The operation of the device depends on the creation of a magnetic field which partially changes with the magnetic flux density around the conductor. The device is discussed in detail in EP-A-O 345 767 which comments on its complexity and on the fact that it employs three separate parameters, namely temperature, current density and magnetic flux density to achieve the desired current limitation. EP-A-O 345 767 itself relates to a superconducting fault current limiter in which only the critical current density is used to cause a superconductive material to pass from the superconducting to the non-superconducting state.

SUMMARY OF THE INVENTION

In order to be able to optimize a fault current limitation apparatus of a kind that includes a superconductor, there is a need for a simple means to enable the critical current density of a given superconductor to be selected from within a range of values. The current invention provides this means or an analogous means for the operation of a superconducting device of another kind.

According to the present invention there is provided apparatus including a cryogenic vessel for holding a superconductor in a volume of cryogenic liquid, wherein the vessel has associated therewith means for setting the pressure within the ullage space of the vessel at a chosen value. The invention also provides fault current limiting apparatus including said vessel and said pressure setting means.

The means for setting the pressure may, for example, comprise a pressure regulator. Alternatively, the means for setting the pressure may comprise an on-off valve operatively associated with a pressure sensor positioned so as to be able to sense the pressure in the vessel.

The pressure setting means is preferably manually adjustable without being dismantled in order to adjust the chosen pressure.

One or more of a number of different advantages may, we believe, be realized by use of a vessel according to the present invention as part of a fault current limiter. First, the ability to set the operating pressure provides an ability to set the critical current density within given limits according to the characteristics of a given superconductor. This ability to set the critical current density arises from the temperature dependence of the critical current density, the operating pressure of the cryogenic vessel determining the temperature at which the cryogenic liquid boils and hence the operating temperature of the superconductor. In general, when a high temperature superconductor is used, and the cryogenic liquid is liquid nitrogen, it is preferred to operate at below ambient pressure and most preferably at a pressure in the range of 10 to 100 torr. As the critical current density increases so the mass of superconducting material which needs to be employed to carry a given current reduces, thereby simplifying manufacture of the superconductor. Thus, the ability to set the pressure in the vessel is an important advantage.

The second advantage is that it is difficult to predict the precise properties (for example, variation of critical current density with cryogen vapor pressure in the ullage space) of any given piece of superconductor from theory. Accordingly, two pieces of a given superconducting material, although nominally identical to one another, may have a given critical current density at different temperatures (and hence cryogen vapor pressure in the ullage space). The apparatus according to the invention enables the optimum pressure to be set for each particular piece of superconducting material.

Third, there is a tendency for the superconductor to age with the result that there is some, generally small, variation in its properties with time. The apparatus according to the invention enables adjustments to the operating pressure to be made so as to cater for any variation in the temperature dependence of the critical current density. Fourth, the apparatus according to the invention enables the chosen critical current density to be changed in accordance with any change in the loading on the power line.

It is desirable to maintain uniform conditions within a bath of the cryogenic liquid in the vessel while the superconductor is functioning as such. Preferably, therefore, the level of cryogenic liquid in the bath is maintained constant by means of a level detector which is operatively associated with a valve controlling the flow of cryogenic liquid into the vessel. The bath preferably also has immersed therein a member which has an enhanced heat transfer surface that promotes nucleate boiling. Such a surface is described in our European patent application 0 303 493A. If desired, the surface may be provided on the superconductor itself or may be provided on a dummy member immersed in the cryogenic liquid. By promoting nucleate boiling, the degree of superheating required to initiate boiling of cryogenic liquid is kept to a minimum (typically less than 2° K. for liquid nitrogen). It needs nonetheless to be borne in mind that the phenomenon of superheating, that is the difference between the boiling temperature of the liquefied gas and the "wall" temperature needed to initiate boiling, results in the actual temperature of the superconductor when boiling commences being a little above that of the liquefied gas itself. Thus, the precise relationship between the critical current density of the superconductor and the cryogen vapor pressure on the ullage space of the vessel is affected by the degree of superheating that occurs in practice. This relationship may, however, be determined empirically for a number of different pressures and the chosen value of the pressure selected in the light of this empirical determination. It is desirable also to keep the effects of any stratification of the cryogenic liquid to a minimum. (By "stratification" is meant a variation in the temperature of the cryogenic liquid with depth.) Accordingly an elongate superconductor is preferably disposed generally horizontally. If desired, the bath of cryogenic liquid may be provided with a stirrer so as to guard against the tendency for stratification to occur. Another alternative is the employ a pump continuously to circulate cryogenic liquid to and from the vessel.

It is also desirable to limit the "heat inleak" into the bath while the superconductor is operating as such. Accordingly, the vessel is preferably vacuum-insulated. The vessel may be fabricated from any material commonly used for making vacuum-insulated vessels. If the material is electrically conducting, then care should be taken to ensure that the superconductor and its leads are properly electrically insulated from the walls of the vessel.

The leads to the superconductor preferably pass through a duct or ducts through which in operation vaporized cryogenic liquid passes out of the vessel. Such vapor gas is thus able to conduct away heat from the leads. If the vessel is operated at a sub-atmospheric pressure and the source of the cryogenic liquid is maintained at atmospheric or a super-atmospheric pressure, then an appreciable volume of flash gas will be created on introducing cryogenic liquid into the vessel. If desired, an intermediate vessel may be employed to hold cryogenic liquid, such intermediate vessel being operated at substantially the same pressure as the vessel according to the invention, whereby at least most of the flash gas is created in the intermediate vessel and does not therefore affect the operation of the vessel according to the invention.

When the superconductor goes normal, there is a large instantaneous evolution of heat which may cause a local increase in temperature of at least several degrees K. There is thus a sudden evolution of vapor. Such vapor may temporarily cause the operating pressure in the vessel to rise. It is therefore desirable that the vessel according to the invention be designed to be able readily to cope with such a sudden evolution of vapor by having suitably designed outlet or outlets for the vapor. If desired, a plurality of vacuum pumps may be employed to ensure rapid removal of the vapor when the vessel is operated at sub-atmospheric pressure.

The superconductor is preferably one with a high critical temperature. Those materials which are superconducting at liquid nitrogen temperatures are particularly preferred. The most preferred superconductors are those which are able to carry relatively large currents. A range of high temperature superconductors is discussed in "Low Temperature Technology" volume 1, 4, November 1990, in an article by W Y Liang entitled "Progress in High Tc Superconductors", pages 17 to 20. Among the superconductors listed in that article, the BiSrCaCuO superconductor is particularly preferred because it is able to conduct relatively large currents at relatively high current densities.

Many power transmission lines are based on a 3 phase alternating current supply. Preferably, each phase has associated therewith its own fault current limiter according to the invention.

BRIEF DESCRIPTION OF THE DRAWINGS

A vessel and fault current limiter according to the invention will now be described by way of example with reference to the accompanying drawings, in which.

DETAILED DESCRIPTION OF THE INVENTION

Figure 1:
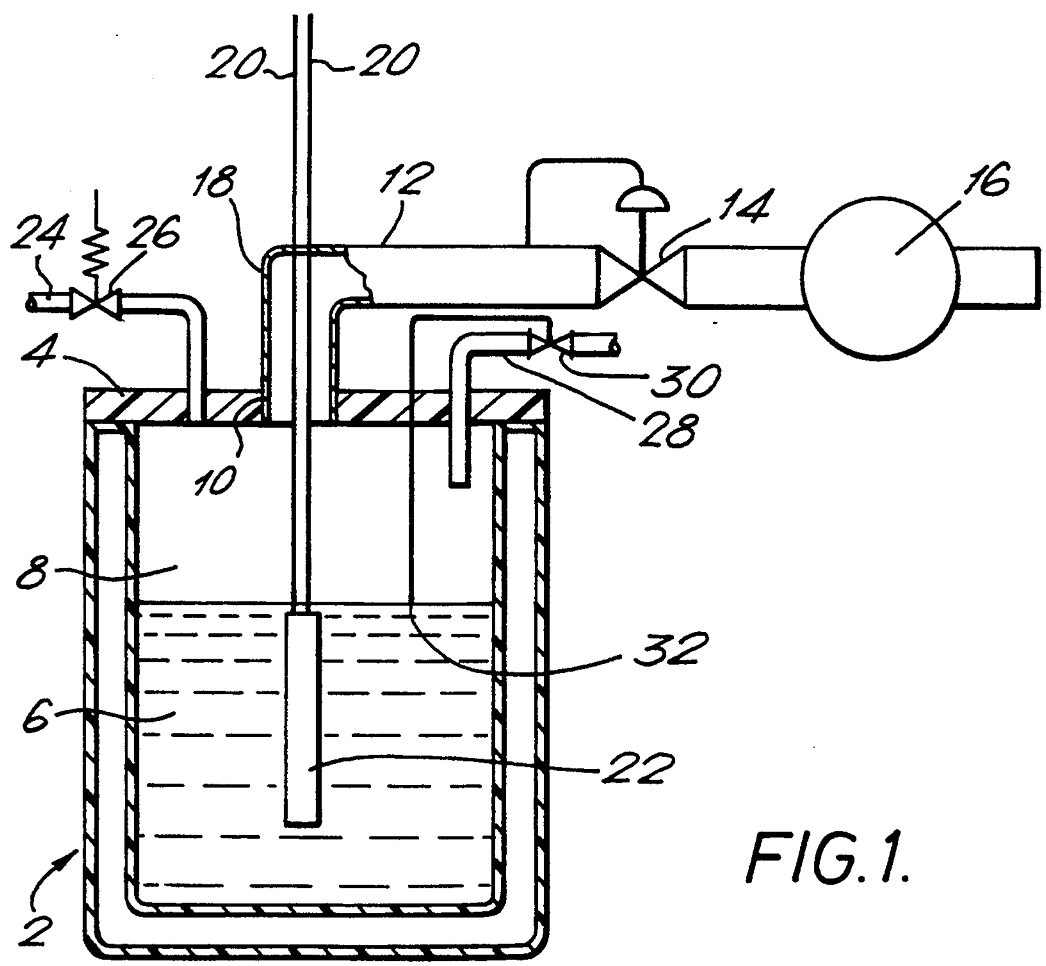
FIG. 1 is a schematic side elevation of a vessel according to the invention and is not to scale.

Referring to FIG. 1 of the drawings, a vacuum-insulated vessel 2, whose walls are formed of fibre glass or other suitable material, has a closure 4 and contains a volume 6 of liquid nitrogen. An ullage space 8 is provided in the vessel 2 between the liquid nitrogen surface and the closure 4. There is an outlet 10 formed in the closure 4. The outlet 10 communicates with a duct 12 in which is disposed a manually adjustable back pressure regulator 14 suitable for operation at sub-ambient temperature. A suitable regulator 14 for use in the apparatus according to the invention is Tescom (TM) H732 (44-3000) series vacuum regulator, available from the Pressure Controls Division of Tescom, Minnesota, USA. Downstream of the regulator 14 is a vacuum pump 16. The duct 12 is typically formed with a bend 18. Normally conducting copper leads 20 extend from outside of the duct 12 and the vessel 2 through the wall of the duct 12 in the region of the bend 18 into the vessel 2 itself and terminate in an elongate, horizontally disposed, body 22 of material, comprising a non-conductive ceramic carrying a thin coating or coatings of a high temperature superconducting material, wholly immersed in the volume 6 of liquid nitrogen. The extent to which the leads 20 extend into the volume of liquid nitrogen is preferably kept to a minimum. The body 22 may be provided with a porous enhanced heat transfer surface that promotes nucleate boiling. Such a surface can be formed by applying a suitable material to the superconductor, for example by using the procedure described in our European patent application 0 303 493A.

The closure 4 of the vessel 2 is preferably provided with a second outlet 4 which communicates with a pressure relief valve 26 which is set to open in the event of an excess pressure being created in the vessel 2. A liquid filling pipe 28 passes through the closure 4 and terminates at one end in a chosen location within the vessel 2 and at its other end in a source (not shown) of liquid nitrogen. The pipe 28 has an automatically operable stop valve 30 located therein. The valve 30 is operatively associated with one or more level sensors 32 located at a chosen position within the interior of the vessel 2. The arrangement is such that the level sensor or sensors are able to sense the presence or absence of liquid nitrogen and provide appropriate signals which are used to actuate the opening and closing of the valve 30 so as to keep the level of liquid nitrogen in the vessel 2 substantially constant.

In operation, the vacuum pump 16 is operated to create a vacuum within the ullage space 8 of the vessel 2. The back pressure regulator 14 is effective to maintain this pressure substantially constant. The pressure in the ullage space B determines the temperature at which the liquid nitrogen boils. Since this temperature is well below ambient temperature, the liquid nitrogen tends to be at its boiling point. Accordingly, the temperature to which the superconductor 22 is subjected depends on the pressure in the ullage space 8. This pressure is able to be selected by appropriate adjustment of the back pressure regulator 14. Accordingly, the temperature to which the superconductor 22 is subjected is able to be selected by appropriately setting the back pressure regulator 14. This temperature in turn determines the actual critical current density of the superconductor 22. If desired, a graph of operating pressure against critical current density can thus be plotted from measurements of the critical current density of a particular superconductor at different pressures, and then the operating pressure (i.e. the pressure in the ullage space 8) selected so as to give an optimum critical current. Such an empirical determination enables such factors as superheating to be taken into account. The actual operating pressure is selected so that the actual current density that the superconductor 22 is required to carry when the current is normal (i.e. when there is no fault) is the critical value or one a little therebelow. If a fault current well above the normal current occurs, the current density substantially instantaneously rises above the critical value and the superconductor 22, again substantially instantaneously, becomes a resistor. There is therefore a large mount of resistive heating which causes the rate of evaporation of liquid nitrogen to increase considerably. This in turn gives rise to an increased rate of supply of liquid nitrogen through the filling pipe 28 in order to compensate for the increased rate of boil off of liquid nitrogen. Accordingly, the temperature in the volume 6 of liquid nitrogen is able to return to its boiling point at the operating pressure.

Figure 2:
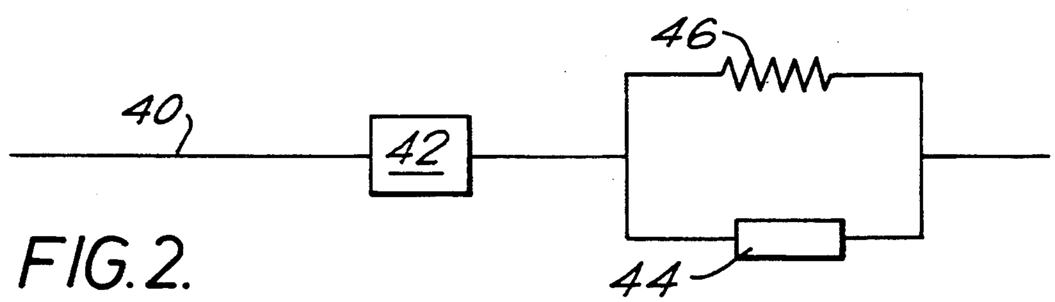
FIG. 2 is a circuit diagram of a fault current limiter which is able to employ the vessel shown in FIG. 1.

Referring to FIG. 2, there is shown a fault current limiter circuit which employs the apparatus shown in FIG. 1. The circuit comprises one phase of a power transmission line 40 having a conventional circuit breaker 42 disposed therealong. The line 40 is connected to a parallel arrangement of a resistor (or reactance) 44 and a superconductor 46. The superconductor 46 is maintained at a chosen temperature and pressure as described with reference to FIG. 1. The resistor 44 is maintained at ambient temperature. That is to say, the resistor 44 is not located within the vessel according to the invention. When the superconductor 46 functions as such, all the current being transmitted along the line flows through it. The value of the resistor 44 is however negligible compared with that of the superconductor 44 in its resistive mode. Accordingly, all the current now flows through the resistor 44 which therefore helps to protect equipment electrically connected to the line 40. The sensor (not shown) associated with the circuit breaker 42 will after a few cycles of the alternating current cause the circuit breaker to be actuated and break the circuit.

Many alternative fault current limiting circuits to that shown in FIG. 2, but all including a superconductor, may be used and are described in the open literature. It is to be appreciated that the apparatus according to the invention may be used in any such fault current limiting circuit.

Although the invention has been described with reference to specific example, it would be appreciated by those skilled in the art that the invention may be embodied in many other forms.

I claim:

1. Apparatus including a cryogenic vessel for holding a superconductor in a volume of cryogenic liquid, wherein the vessel has associated therewith valve means for setting the pressure within the ullage space of the vessel at a chosen pressure value and means for selecting the chosen pressure value to correspond to the pressure needed to operate the superconductor at the critical current density.

2. Apparatus as claimed in claim 1, in which the value means for setting the pressure comprises a back pressure regulator.

3. Apparatus as claimed in claim 1, in which the value means is manually adjustable without being dismantled in order to adjust the chosen pressure.

4. Apparatus as claimed in claim 1, in which the apparatus additionally includes a vacuum pump.

5. Apparatus as claimed in claim 1, in which the value means for setting the pressure is able to set said pressure at a value in the range of 10 to 100 tort.

6. Apparatus as claimed in claim 1, in which the superconductor is held immersed within a volume of the cryogenic liquid, and the apparatus additionally includes means for maintaining the cryogenic liquid at a constant level.

7. Apparatus as claimed in claim 6, in which there is immersed in the cryogenic liquid a member having a heat transfer surface that promotes nucleate film boiling.

8. Apparatus as claimed in claim 7, in which the superconductor itself has said heat transfer surface.

9. Apparatus as claimed in claim 1, in which electrically conducting leads to the superconductor pass through a duct or ducts through which, in operation, vaporized cryogenic liquid passes.

10. Apparatus as claimed in claim 1, in which the superconductor is a high temperature superconductor.

11. Apparatus as claimed in claim 10, in which the superconductor is BiSrCaCuO.

12. Apparatus as claimed in claim 1, in which the cryogenic liquid is liquid nitrogen.

13. Apparatus as claimed in claim 1, wherein the apparatus maintains the superconductor at a chosen temperature.

14. A fault current limiter apparatus comprising:

at least one power transmission line;

a circuit breaker operatively connected to the power transmission line;

a parallel arrangement of a resistor and a superconductor operatively connected to the power transmission line downstream of the circuit breaker; and a device for holding the superconductor in a volume of cryogenic liquid comprising a vessel for holding the cryogenic liquid and defining an ullage space and valve means for setting the pressure within the ullage space at a chosen pressure value and means for selecting the chosen pressure value to correspond to the pressure needed to operate the superconductor at the critical current density.

15. The fault current limiter apparatus of claim 14 wherein the power transmission line comprises a three phase alternating current transmission line, each phase of said transmission line having said circuit breaker, said parallel arrangement of the resistor and superconductor and said device for holding the superconductor.

* * * * *